(12) United States Patent
Ylikunnari et al.

(10) Patent No.: US 11,051,409 B2
(45) Date of Patent: Jun. 29, 2021

(54) ELECTRONIC CIRCUIT

(71) Applicant: TEKNOLOGIAN TUTKIMUSKESKUS VTT OY, Espoo (FI)

(72) Inventors: Mari Ylikunnari, Oulu (FI); Terho Kololuoma, Oulu (FI)

(73) Assignee: TEKNOLOGIAN TUTKIMUSKESKUS VTT OY, Espoo (FI)

( * ) Notice: Subject to any disclaimer, the term of this patent is extended or adjusted under 35 U.S.C. 154(b) by 0 days.

(21) Appl. No.: 16/966,687

(22) PCT Filed: Jan. 31, 2019

(86) PCT No.: PCT/FI2019/050070
§ 371 (c)(1),
(2) Date: Jul. 31, 2020

(87) PCT Pub. No.: WO2019/150001
PCT Pub. Date: Aug. 8, 2019

(65) Prior Publication Data
US 2021/0037658 A1 Feb. 4, 2021

(30) Foreign Application Priority Data
Feb. 1, 2018 (FI) .................................... 20185093

(51) Int. Cl.
*H05K 1/09* (2006.01)
*H05K 3/32* (2006.01)
*H05K 1/03* (2006.01)
*H05K 1/11* (2006.01)

(52) U.S. Cl.
CPC ............. *H05K 3/325* (2013.01); *H05K 1/032* (2013.01); *H05K 1/0386* (2013.01); *H05K 1/092* (2013.01); *H05K 1/111* (2013.01); *H05K 2201/083* (2013.01)

(58) Field of Classification Search
CPC ................................................ H05K 1/09–097
See application file for complete search history.

(56) References Cited

U.S. PATENT DOCUMENTS

2004/0241394 A1  12/2004  Burrows
2007/0092660 A1   4/2007  Shim et al.
2010/0197148 A1   8/2010  Rudisill et al.
(Continued)

FOREIGN PATENT DOCUMENTS

GB    1 299 541       12/1972
WO   2010/121666     10/2010

OTHER PUBLICATIONS

International Search Report and Written Opinion of the ISA for PCT/FI2019/050070 dated May 21, 2019, 9 pages.
(Continued)

*Primary Examiner* — Jeremy C Norris
(74) *Attorney, Agent, or Firm* — Nixon & Vanderhye P.C.

(57) ABSTRACT

An electronic circuit (4) comprises at least one electrically conductive portion arranged to a substrate (2) and at least one electrical coupling point (5) determined at the at least one electrically conductive portion. The electronic circuit (4) comprises at the at least one electrical coupling point (5) at least one magnetic and electrically conductive coupling element (6a, 6b, 6c, 6d, 6e, 6f, 6g, 6h, 6i, 6j, 6k, 6l) for providing an electrically conductive coupling point (5) with magnetic fastening force.

10 Claims, 3 Drawing Sheets

(56) References Cited

U.S. PATENT DOCUMENTS

| | | |
|---|---|---|
| 2013/0273752 A1 | 10/2013 | Rudisill et al. |
| 2015/0199858 A1 | 7/2015 | Salmon et al. |
| 2015/0302964 A1 | 10/2015 | Bell et al. |
| 2016/0099517 A1 | 4/2016 | Fernandes et al. |
| 2016/0197417 A1 | 7/2016 | Busbee |
| 2016/0198576 A1 | 7/2016 | Lewis et al. |

OTHER PUBLICATIONS

FI Search Report for FI20185093 dated Aug. 14, 2018, 2 pages.
FI Office Action for FI20185093 dated Feb. 19, 2020, 5 pages.

ELECTRONIC CIRCUIT

This application is the U.S. national phase of International Application No. PCT/FI2019/050070 filed Jan. 31, 2019 which designated the U.S. and claims priority to FI Patent Application No. 20185093 filed Feb. 1, 2018, the entire contents of each of which are hereby incorporated by reference.

FIELD OF THE INVENTION

The invention relates to an electronic circuit and more particularly to an electronic circuit comprising at least one electrically conductive portion arranged to a substrate and at least one electrical coupling point arranged at the at least one electrically conductive portion.

BACKGROUND OF THE INVENTION

Electronic devices comprises circuit boards that comprise a substrate that is a plate-like or a sheet-like part that provides a supporting body for a number of electrically conductive portions, such as electrically conductive conductors printed to the substrate, the electrically conductive portions providing an electronic circuit. The electronic circuit further comprises at least one electrical coupling point for connecting the electronic circuit to another electronic circuit in the same electronic device or in a different electronic device or for assembling an electronic component to the electronic circuit. The electrical coupling point may comprise a single electrical junction or a group of electrical junctions.

The electrical couplings are many times made with external wirings, wherein metallic contact clips are soldered to the wire. Instead of soldering also gluing with anisotropic or isotropic conductive adhesives is applied. The connection between the wire and the metallic contact clip is permanent in both cases but can still broke easily and requires strengthening material around. The wires are also in view which may also be an aesthetic disadvantage.

There are available also connectors utilizing magnetic force wherein the magnetic force provided by magnets is used for mechanical connecting, and electrical connections are provided by electrical connectors. The magnets are heavy and difficult to attach to a flexible substrate formed of plastic or paper sheet.

BRIEF DESCRIPTION OF THE INVENTION

An object of the present invention is to provide a novel electronic circuit and a method for manufacturing thereof.

The invention is characterized by the features of the independent claims.

An electronic circuit comprises at least one electrically conductive portion arranged to a substrate and at least one electrical coupling point determined at the at least one electrically conductive portion. The electronic circuit further comprises at the at least one electrical coupling point at least one magnetic and electrically conductive coupling element for providing an electrically conductive coupling point with magnetic fastening force.

With the coupling elements disclosed herein it is possible to provide in a simple way both a mechanical connection and an electrical connection between two objects to be connected to each other. Furthermore, when the mechanical connection between the objects are provided by magnetic force, the objects can also be disconnected from each other easily for example for replacing a malfunctioned object to a new one or for replacing an original object comprising a specific functionality by another object comprising another functionality in order to replace the original functionality of the electronic circuit by a new one.

Some embodiments of the invention are disclosed in the dependent claims.

BRIEF DESCRIPTION OF THE DRAWINGS

In the following the invention will be described in greater detail by means of preferred embodiments with reference to the accompanying drawings, in which.

For the sake of clarity, the figures show some embodiments of the invention in a simplified manner. Like reference numerals identify like elements in the figures.

DETAILED DESCRIPTION OF THE INVENTION

Figure 1:
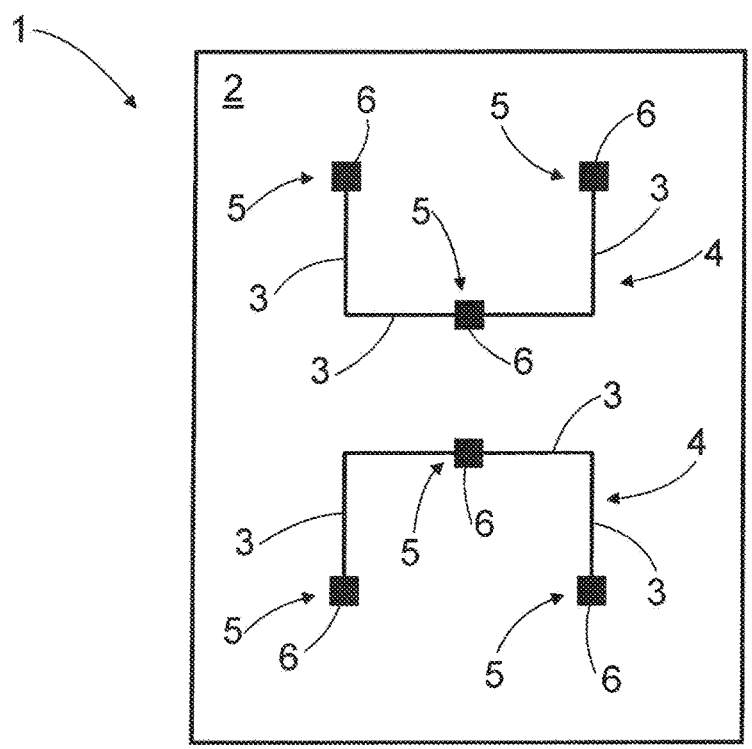
FIG. 1 shows schematically a circuit board.

FIG. 1 shows schematically a circuit board 1. The circuit board 1 comprises a substrate 2 or a backplane 2, which is a plate-like or a sheet-like part or element. The circuit board 1 further comprises a number of electrically conductive conductors 3 arranged to the substrate 2. The electrically conductive conductors 3 provide one kind of electrically conductive portions arranged to the substrate 2. The electrically conductive portions arranged to the substrate 2 form a number of electronic circuits 4 arranged to the substrate 2, the number of the electronic circuits 4 being two in the embodiment of FIG. 1. The substrate 2 provides a base onto which the one or more electronic circuits 4 and possible electronic components to be attached to the electronic circuits 4 are arranged to.

At least some of the electrically conductive conductors 3 may be arranged very close to each other so that these electrically conductive conductors 3 provide one or more conductor buses. The one or more electrically conductive conductors 3 may be arranged to only one side of the substrate 2, whereby the circuit board 1 is a one-sided circuit board 1 if the implementation of the conductors 3 is considered to. Alternatively the one or more electrically conductive conductors 3 may be arranged to both sides of the substrate 2, whereby the circuit board 1 is a two-sided circuit board 1 if the implementation of the conductors 3 is considered to. For the sake of clarity, the embodiment of FIG. 1 discloses the electrically conductive conductors 3 on only one side of the substrate 2.

The substrate 2 of the circuit board 1 may be a substantially rigid plate-like substrate comprising for example one or more sheet layers of copper or aluminium laminated onto and/or between sheet layers of a non-conductive material.

Alternatively the substrate 2 of the circuit board 1 may be a flexible sheet-like part or element which is able to bend at least to some extent so that the substrate 2 does not disrupt or break due to the bending. The materials like that may comprise for example different kind of paper-based materials or plastic-based materials, such as polyimide (PI), polyethylene terephthalate (PET), ethylene tetrafluoroethylene (ETFE) polyethylene naphtalene (PEN), polymethyl methacrylate (PMMA), cyclo-olefinic polymer/co-polymer (COP/COC), polyethene (PE), cellulose acetate (CA), polystyrene (PS), polyvinyl chloride (PVC), polymer coated paper/cardboard or other fiber based product, metal coated or laminated plastic or fiber based material. The thickness of the substrate 2 of this kind may for example be 50-250 micrometres but the substrate 2 may also be thicker or thinner than that.

Alternatively the substrate 2 may be formed by additive manufacturing methods, such as 3D-printing.

The substrate 2 may have any desired shape, i.e. the substrate 2 may be cut to any desired shape. Therefore edges of the substrate 2 may comprise straight and/or curved portions, for example.

There are a number of materials to be used for electrically conductive conductors 3 as well as a number of ways to arrange or apply the electrically conductive conductors 3 to the substrate 2.

According to an embodiment the electrically conductive conductors 3 may be of an electrically conductive ink, such as silver based ink material that is printed to the surface of the flexible substrate 2.

According to another embodiment the electrically conductive conductor 3 may be of an electrically conductive ink that is pressed to the surface of the flexible substrate 2.

According to still another embodiment the electrically conductive conductor 3 may be of copper or aluminium, for example, whereby there is at least one layer of copper or aluminium in the substrate 2 and part of it is removed by utilizing techniques of exposure to light and etching for providing the conductors 3. Other materials for the electrically conductive conductors 3 and/or techniques for providing the electrically conductive conductors 3 to the surface of the substrate 2 are also possible.

The electrically conductive conductors 3 are an embodiment of electrically conductive portions arranged to the substrate 2. Electrically conductive portions may be arranged to the substrate 2 also for example with different kind of electrically active materials applied or arranged to the substrate 2, whereby the electrically active material may even form a part of the substrate 2. In the following examples it is assumed, for the sake of clarity, that the electrically conductive portions in the substrate 2 of the circuit board 1 are provided by electrically conductive conductors 3.

The electronic circuit 4 comprises a number of electrical coupling points 5 or junction points 5, i.e. one or more coupling points 5 or junction points 5, determined at the at least one electrically conductive conductor 3 for connecting the circuit board 1 to a counterpart object. The counterpart object may for example be another circuit board or an electronic component, such as a microcircuit, to be set onto the circuit board 1.

The coupling point 5 comprises at least one magnetic and electrically conductive coupling element 6 for providing the electrically conductive coupling or junction with magnetic fastening force. The coupling element 6 provides an electrically conductive element to connect the circuit board 1 electrically to the counterpart object. The coupling element 6 provides additionally also a magnetic fastening element to attach or fasten the circuit board 1 mechanically by the magnetic fastening force to the counterpart object. The magnetic and electrically conductive coupling element 6 is thus intended both to connect the circuit board electrically to the counterpart object and to fasten the circuit board 1 mechanically to the counterpart object by the magnetic fastening force. As said above, the counterpart object may for example be another circuit board or an electronic component, such as a microcircuit, to be set onto the circuit board 1.

The electrically conductive coupling element 6 may be formed as a conduction pad formed of printable magnetic and electrically conductive ink applied at the circuit board 1 at the coupling point 5, i.e. the magnetic and electrically conductive coupling element 6 may be formed as a planar magnet made of at least one layer of magnetic and electrically conductive ink, or several successive layers of magnetic and electrically conductive ink, or of some predetermined amount of magnetic and electrically conductive ink applied at the coupling point. The magnetic and electrically conductive ink may comprise for example iron Fe, elementary cobalt Co, nickel Ni or samarium-cobalt SmCo, i.e. an alloy of samarium Sm and cobalt Co. Magnetic and electrically conductive particles in the magnetic and electrically conductive ink may thus be for example elements of iron Fe, elementary cobalt Co, nickel Ni, samarium-cobalt SmCo or different kind of compounds with a basic composition of $SmCo_5$, $Sm_2Co_{17}$ or $Nd_2Fe_{14}B_2$, for example. The magnetic and electrically conductive particles may also be coated particles for increasing corrosion resistance thereof.

Solid matter in the ink may for example comprise 60-100 wt.-% magnetic particles and 0-40 wt.-% adhesive. Additionally the magnetic and electrically conductive ink may comprise different additives for improving printability of the ink, such as surface-active agents, defoaming agents or waxes. The adhesive may be cured thermally, chemically or by suing light, or the curing of the adhesive may take place as a result of evaporation of solvent substance. The solvent substance may be water or organic substance. The concentration of the solvent substance in the ink may be 0-95 wt.-% of the amount of solid matter in the ink.

After the printable magnetic and electrically conductive ink has been applied at the coupling point 5 for providing the magnetic and electrically conductive coupling element 6, it may be magnetized, for example by an effect of an external electric field, to comprise a single specific magnetic polarity or magnetic orientation, i.e. either a magnetic north N or a magnetic south S. Alternatively the coupling element 6 may be magnetized to comprise a number of areas or portions, i.e. at least two areas or portions, having different magnetic polarities, i.e. a magnetic north N or a magnetic south S, as schematically explained later in FIGS. 2, 3, and 4, for example. The magnetic and electrically conductive particles may also be oriented to the direction of the magnetic field either before or during the magnetization.

The coupling element 6 formed as a conduction pad, i.e. as a planar magnet, formed only of printable magnetic and electrically conductive ink provides a coupling element 6 which is very durable and strong and is therefore especially suitable to be used in circuit boards 1 comprising a flexible substrate 2.

In circuits boards 1 with a substantially rigid substrate 2 the coupling point 5 may alternatively comprise a coupling element which is coated with at least one layer of printable magnetic and electrically conductive ink. In this kind of embodiment the coupling point may comprise an electrically conductive bottom element which is attached to the substrate 2 at the electrically conductive portion, the electrically conductive bottom element providing a basement of the coupling element 6 at the coupling point 5. The bottom element is then coated with at least one layer of printable magnetic and electrically conductive ink for providing the electrically conductive coupling point or junction with magnetic fastening force. The electrical resistance of this kind of coupling element may be smaller than the electrical resistance of the conduction pad or the planar magnet as explained in preceding paragraphs because electrical conductivity in the magnetic and electrically conductive ink is typically not as good as it is in copper or silver based electrode materials. In circuits boards 1 with the substantially rigid substrate 2 the coupling element 6 may, however, also be formed as the conduction pad or the planar magnet as explained in preceding paragraphs.

Figure 2:
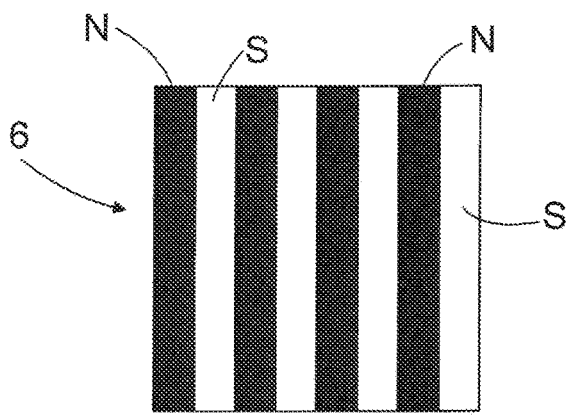
FIGS. 2, 3 and 4 show schematically exemplary magnetic orientations of some magnetic and electrically conductive coupling elements.
Figure 3:
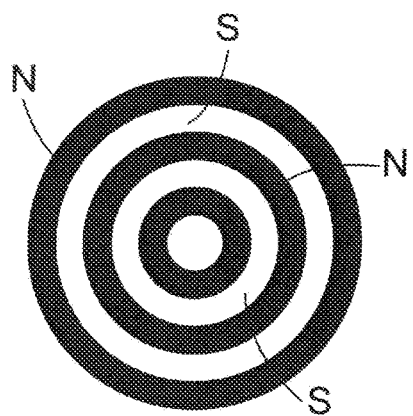
Figure 4:
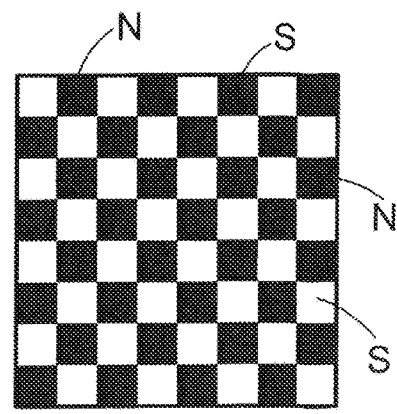

FIGS. 2, 3 and 4 show schematically exemplary magnetizations or magnetic orientations of some magnetic and electrically conductive coupling elements 6 formed as conduction pads or planar magnets, wherein the coupling element 6 comprises a number of, i.e. at least two, different areas or portions having different magnetic polarities.

In the embodiment of FIG. 2 the magnetic and electrically conductive coupling element 6 has a number of adjacent areas or portions having a form of vertical lines or rectangles with different magnetic polarities such that every other adjacent area indicated by black colour has the magnetic polarity of the magnetic north N and every other adjacent area indicated by white colour has the magnetic polarity of the magnetic south S.

In the embodiment of FIG. 3 the magnetic and electrically conductive coupling element 6 has a number of areas or portions having a form of circles lying within each other and having different magnetic polarities such that every other area or circle indicated by black colour has the magnetic polarity of the magnetic north N and every other circle as indicated by white colour has the magnetic polarity of the magnetic south S.

In the embodiment of FIG. 4 the magnetic and electrically conductive coupling element 6 has a checker board pattern formed of a number of adjacent areas or portions having a form of rectangles with different magnetic polarities such that in vertical and horizontal directions every other adjacent area indicated by black colour has the magnetic polarity of the magnetic north N and every other adjacent area indicated by white colour has the magnetic polarity of the magnetic south S.

The coupling elements 6 comprising a number of areas or portions having different magnetic polarities may be used to verify the correct orientation or positioning of the counterpart object, or to force the correct orientation or positioning of the counterpart object, when it is connected to the circuit board 1 in question. In this kind of application it is assumed that the counterpart object, which may for example be another circuit board or an electronic component, such as a microcircuit, has compatible coupling elements with substantially compatible dimensioned areas or portions but with magnetically opposite polarities relative to those described in FIGS. 2 to 4.

Alternatively the coupling element 6 may comprise or be composed of a single area or a portion having only a single magnetic polarity, i.e. the magnetic north N or the magnetic south S. One or more coupling elements 6 like that may also be utilized for verifying the correct orientation or positioning of the counterpart object by applying a specifically organized magnetization pattern of the coupling elements, if the counterpart object realizes a compatible magnetization pattern with opposite magnetic polarities relative to that of the magnetization pattern in the circuit board 1 in question herein.

With the coupling elements disclosed herein it is possible to provide both the mechanical connection and the electrical connection between two objects to be connected to each other without any soldering or gluing process. When the mechanical connection between the objects are provided by magnetic force generated between the objects, the objects can also be disconnected from each other easily for example for replacing a malfunctioned object by a new one or for replacing an original object comprising a specific functionality by another object comprising another functionality in order to replace the original functionality of the electronic circuit by a new one.

Figure 5:
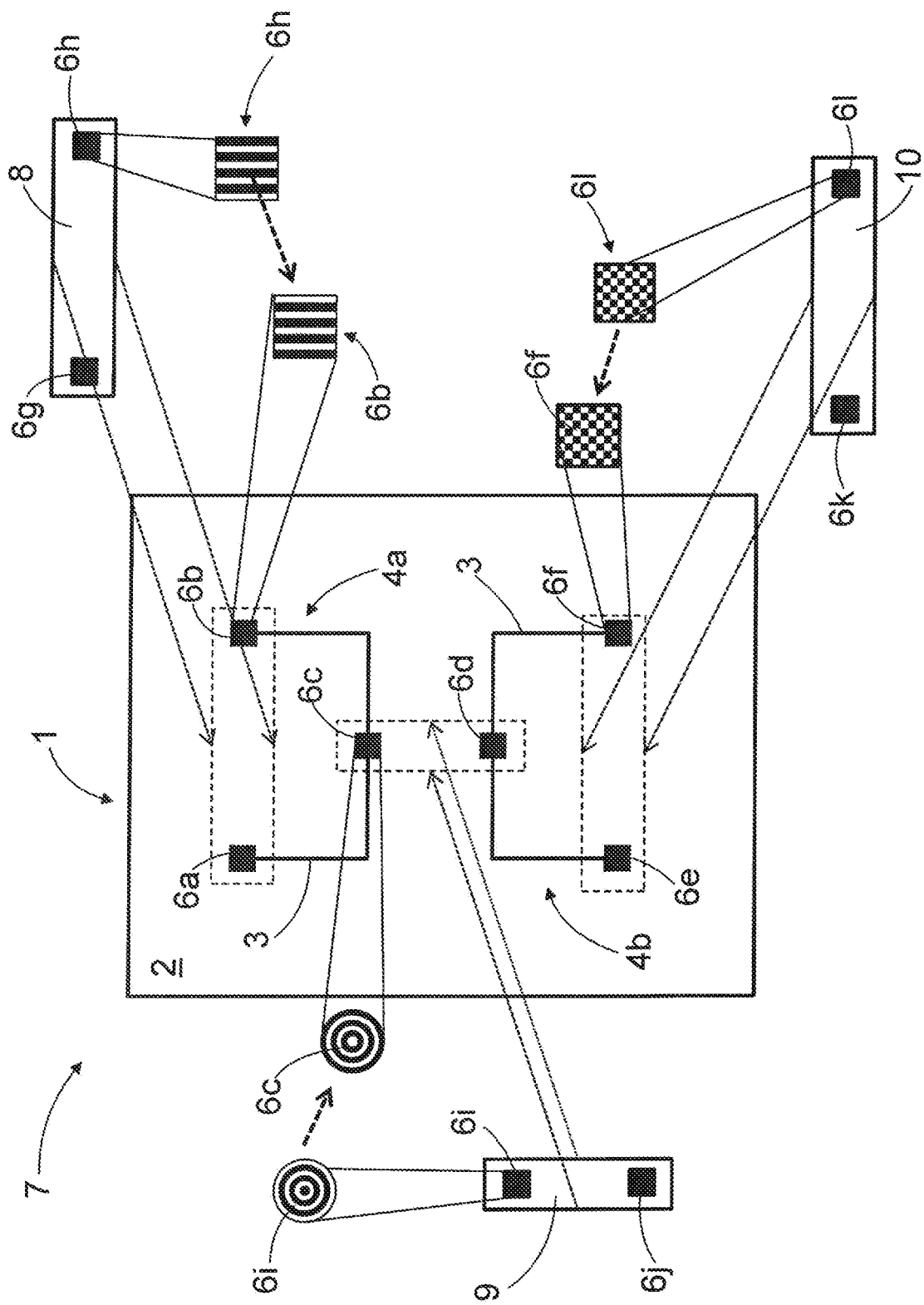
FIG. 5 shows schematically an electronic system.

FIG. 5 discloses schematically an electronic system 7. The electronic system 7 comprises a circuit board 1 like that disclosed in FIG. 1. The circuit board 1 comprises two electronic circuits 4, i.e. the first electronic circuit 4a and the second electronic circuit 4b.

The first electronic circuit 4a comprises altogether three coupling points 5 being formed of a first coupling element 6a, a second coupling element 6b and a third coupling element 6c. The second coupling element 6b has the implementation similar to that of FIG. 2 and the third coupling element 6c has the implementation similar to that of FIG. 3.

The second electronic circuit 4b also comprises altogether three coupling points 5 being formed of a fourth coupling element 6d, a fifth coupling element 6e and a sixth coupling element 6f. The sixth coupling element 6f has the implementation similar to that of FIG. 4.

The electronic system 7 of FIG. 5 further comprises three objects, i.e. a first object 8, a second object 9 and a third object 10, to be connected to the circuit board 1. The first object 8, the second object 9 and the third object 10 may for example be another circuit boards or electronic components, such as microcircuits, to be connected to the circuit board 1. Each of the first object 8, the second object 9 and the third object 10 may provide different functionalities when connected to the circuit board 1.

The first object 8 comprises a seventh coupling element 6g and an eighth coupling element 6h. The seventh coupling element 6g is magnetized to have the opposite magnetic polarity relative to that of the first coupling element 6a. The eighth coupling element 6h has the implementation otherwise similar to that of FIG. 2 but in the eighth coupling element 6h the different areas or portions are magnetized to have opposite polarities relative to that shown in FIG. 2, i.e. with oppositely oriented magnetic polarity areas or portions relative to that of the second coupling element 6b.

The second object 9 comprises a ninth coupling element 6i and a tenth coupling element 6j. The ninth coupling element 6i has the implementation otherwise similar to that of FIG. 3 but in the ninth coupling element 6i the different areas or portions are magnetized to have opposite polarities relative to that shown in FIG. 3, i.e. with oppositely oriented magnetic polarity areas or portions relative to that of the third coupling element 6b. The tenth coupling element 6j is oriented to have the oppositely oriented magnetic polarity relative to that of the fourth coupling element 6d.

The third object 10 comprises an eleventh coupling element 6k and a twelfth coupling element 6l. The eleventh coupling element 6k is oriented to have the oppositely oriented magnetic polarity relative to that of the fifth coupling element 6e. The twelfth coupling element 6l has the implementation otherwise similar to that of FIG. 4 but in the twelfth coupling element 6k the different areas or portions are magnetized to have opposite polarities relative to that shown in FIG. 4, i.e. with oppositely oriented magnetic polarity areas or portions relative to that of the sixth coupling element 6f.

The first object 8 is intended to be connected to the first electronic circuit 4a so that the seventh coupling element 6g is to be laid at the first coupling element 6a, which are interconnected to each other mechanically by the magnetic force generated between them due to the oppositely oriented magnetic polarities of the first 6a and the seventh 6g coupling elements. The eighth coupling element 6h is to be laid at the second coupling element 6b, which are interconnected to each other mechanically by the magnetic force generated between them due to the oppositely magnetized polarity areas in the second 6a and the eighth 6h coupling elements being set opposite to each other. Because the second coupling element 6b and the eighth coupling element 6h has the specific layout what comes to the magnetization of the coupling elements, the first object 8 can be connected to the first electronic circuit 4a only in such an orientation or a position wherein the eighth coupling element 6h is to be laid at the second coupling element 6b. Because the coupling elements 6a, 6b, 6g, 6h are made of or comprise magnetic and electrically conductive ink, there is also an electrical connection between the first 6a and the seventh 6g coupling elements and between the second 6b and the eighth 6h coupling elements.

The second object 9 is intended to be connected to the first electronic circuit 4a and to the second electronic circuit 4b, i.e. between the first 4a and the second 4b electronic circuits so that the ninth coupling element 6i is to be laid at the third coupling element 6c, which are interconnected to each other mechanically by the magnetic force generated between them due to the oppositely magnetized polarity areas in the third 6c and the ninth 6i coupling elements being set opposite to each other. The tenth coupling element 6j is to be laid at the fourth coupling element 6d, which are interconnected to each other mechanically by the magnetic force generated between them due to the oppositely oriented magnetic polarities of the fourth 6d and the tenth 6j coupling elements. Because the third coupling element 6c and the ninth coupling element 6i has the specific layout what comes to the magnetization of the coupling elements, the second object 9 can be connected to the first electronic circuit 4a only in such an orientation or a position wherein the ninth coupling element 6i is to be laid at the third coupling element 6c. Because the coupling elements 6c, 6d, 6i, 6j are made of or comprise magnetic and electrically conductive ink, there is also an electrical connection between the third 6c and the ninth 6i coupling elements and between the fourth 6d and the tenth 6j coupling elements.

The third object 10 is intended to be connected to the second electronic circuit 4b so that the eleventh coupling element 6k is to be laid at the fifth coupling element 6e, which are interconnected to each other mechanically by the magnetic force generated between them due to the oppositely oriented magnetic polarities of the fifth 6e and the eleventh 6k coupling elements. The twelfth coupling element 6l is to be laid at the sixth coupling element 6f, which are interconnected to each other mechanically by the magnetic force generated between them due to the oppositely magnetized polarity areas in the sixth 6f and the twelfth 6l coupling elements being set opposite to each other. Because the sixth coupling element 6f and the twelfth coupling element 6l has the specific layout what comes to the magnetization of the coupling elements, the third object 10 can be connected to the second electronic circuit 4b only in such an orientation or a position wherein the twelfth coupling element 6l is to be laid at the sixth coupling element 6f. Because the coupling elements 6e, 6f, 6k, 6l are made of or comprise magnetic and electrically conductive ink, there is also an electrical connection between the fifth 6e and the eleventh 6k coupling elements and between the sixth 6k and the twelfth 6l coupling elements.

Figure 6A:
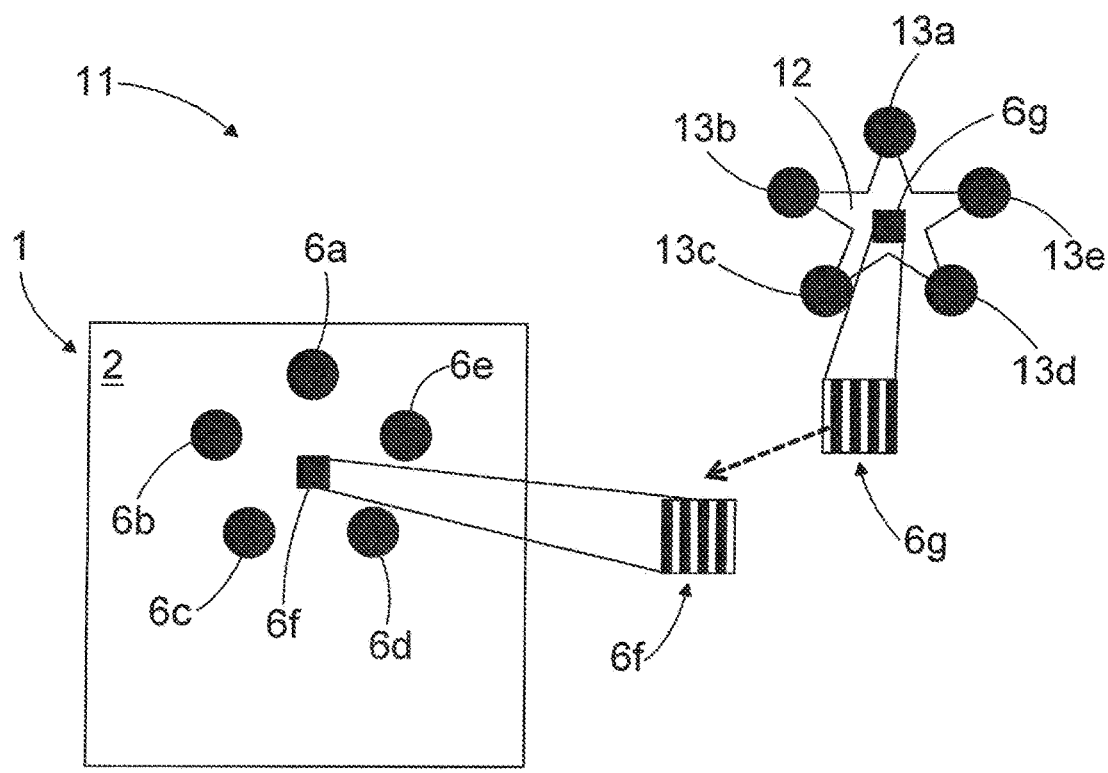
FIG. 6a shows schematically another electronic system before assembling thereof.
Figure 6B:
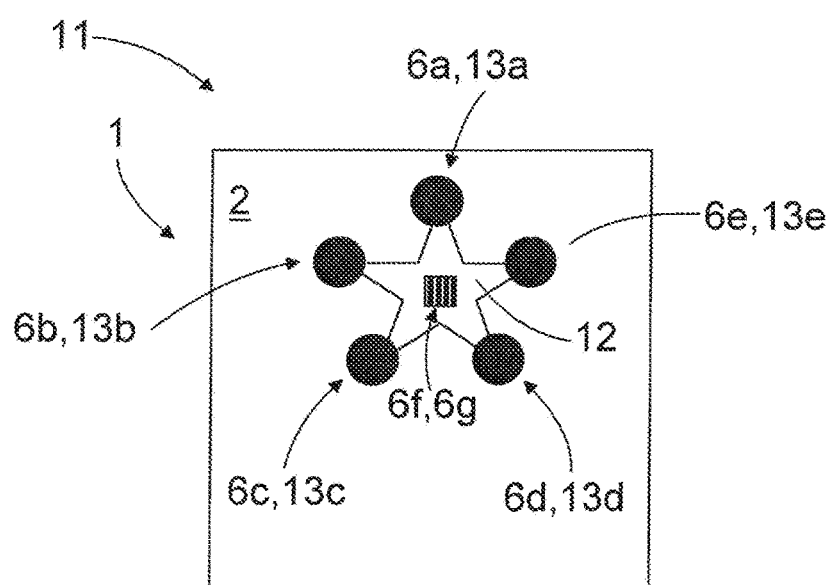
FIG. 6b shows schematically the electronic system of FIG. 6a after assembling thereof.

FIG. 6a shows schematically another electronic system 11 before assembling thereof and FIG. 6b shows schematically the electronic system of FIG. 6a after assembling thereof.

The electronic system 11 of FIGS. 6a and 6b comprises a circuit board 1. The circuit board 1 comprises a substrate 2. Furthermore the electronic system 11 comprises a microcircuit 12 to be assembled to the circuit board 1. For the sake of clarity any electronic circuit 4 with electrically conductive conductors is not shown in FIGS. 6a and 6b.

For assembling the microcircuit 12 to the circuit board 1 the circuit board 1 comprises five coupling elements 6a, 6b, 6c, 6d, 6e formed of printable magnetic and electrically conductive ink for fastening the microcircuit 12 via its metallic contact pins 13a, 13b, 13c, 13d, 13e to the circuit board 1. Because the coupling elements 6a, 6b, 6c, 6d, 6e in the circuit board 1 are made of printable magnetic and electrically conductive ink, the coupling elements 6a, 6b, 6c, 6d, 6e fasten the microcircuit 12 through its contact pins 13a, 13b, 13c, 13d, 13e to the circuit board 1 mechanically by the magnetic force generated between the coupling elements 6a, 6b, 6c, 6d, 6e and the contact pins 13a, 13b, 13c, 13d, 13e. Because the coupling elements 6a, 6b, 6c, 6d, 6e are made of electrically conductive material, the coupling elements 6a, 6b, 6c, 6d, 6e also provide the electrical connections for the pins 13a, 13b, 13c, 13d, 13e of the microcircuit 12.

At the circuit board 1 there is also an additional coupling element 6f having the implementation similar to that disclosed in FIG. 2. At the microcircuit 12 there is, in turn, a coupling element 6g having the implementation otherwise similar to that of FIG. 2 but with areas or portions with opposite polarities relative to that shown in FIG. 2, i.e. with oppositely oriented magnetic polarity areas or portions relative to that of the coupling element 6f.

When the microcircuit 12 is to be assembled to the circuit board 1, the coupling element 6g in the microcircuit 12 is to be set at or against the coupling element 6f in the circuit board 1. Due to the number of the areas or portions in the coupling elements 6f and 6g being magnetized with opposite polarities, the coupling elements 6f and 6g will attach or fasten to each other mechanically by the magnetic force generated between them only in that mutual orientation wherein the areas of the coupling element 6f having the magnetic polarity north N are set against the areas of the coupling element 6g having the magnetic polarity south S and vice versa. This ensures that the microcircuit 12 can be assembled to the circuit board 1 only in one orientation or position wherein specific contact pins 13a, 13b, 13c, 13d, 13e are connected to specific coupling elements 6a, 6b, 6c, 6d, 6e. FIG. 6b shows schematically the microcircuit 12 being assembled to the circuit board 1.

In the embodiment of FIGS. 6a and 6b the coupling elements 6f, 6g are thus utilized to provide a correct mutual orientation between the circuit board 1 and a counterpart thereof, i.e. the microcircuit 12.

When the electronic circuit 4 or the electronic circuit board 1 is manufactured, at least one electrically conductive portion is formed at the substrate and at least one electrical coupling point 5 is determined at the at least one electrically conductive portion. Thereafter at least one magnetic and electrically conductive coupling element 6a, 6b, 6c, 6d, 6e, 6f, 6g, 6h, 6i, 6j, 6k, 6l is arranged at the at least one electrical coupling point 5 for providing an electrically conductive coupling point 5 with magnetic fastening force.

It will be obvious to a person skilled in the art that, as the technology advances, the inventive concept can be implemented in various ways. The invention and its embodiments are not limited to the examples described above but may vary within the scope of the claims.

The invention claimed is:

1. An electronic circuit comprising at least one electrically conductive portion arranged to a substrate and at least one electrical coupling point determined at the at least one electrically conductive portion, wherein
   the electronic circuit comprises at the at least one electrical coupling point at least one magnetic and electrically conductive coupling element for providing an electrically conductive coupling point with magnetic fastening force, and wherein
   the coupling element is a conduction pad formed of printable magnetic and electrically conductive ink and
   the coupling element comprises at least two different areas provided with opposite magnetic polarities.

2. An electronic circuit as claimed in claim 1, wherein the magnetic and electrically conductive coupling element is intended to connect and fasten the electronic circuit with a counterpart object both electrically and mechanically.

3. An electronic circuit as claimed in claim 1, wherein the coupling element comprises at least one layer of printable magnetic and electrically conductive ink.

4. An electronic circuit as claimed in claim 1, wherein the electrically conductive portion is an electrically conductive conductor.

5. An electronic circuit as claimed in claim 1, wherein the substrate is a flexible substrate at which the at least one electrically conductive portion is arranged to.

6. An electronic circuit as claimed in claim 5, wherein the substrate is at least one of plastic and paper.

7. An electronic device comprising at least one electronic circuit as claimed in claim 1.

8. A coupling arrangement comprising at least one electronic circuit as claimed in claim 1 and at least one counterpart object for the at least one electronic circuit to be connected to the at least one electronic circuit both electrically and mechanically through the at least one coupling element in the electronic circuit.

9. A coupling arrangement as claimed in claim 8, wherein a counterpart object for the electronic circuit is at least one of another electronic circuit and an electronic component, wherein the at least one magnetic and electrically conductive coupling element in the electronic circuit is fastened mechanically by a magnetic force to at least one of at least one magnetic and electrically conductive coupling element in another electronic circuit and a contact pin in an electronic component.

10. A method for manufacturing an electronic circuit, comprising forming at least one electrically conductive portion at a substrate,
    determining at least one electrical coupling point at the at least one electrically conductive portion,
    arranging at the at least one electrical coupling point at least one magnetic and electrically conductive coupling element by forming at least one magnetic and electrically conductive conduction pad by applying at least one layer of magnetic and electrically conductive ink at the at least one electrical coupling point for providing an electrically conductive coupling point with magnetic fastening force,
    subjecting the at least one layer of magnetic and electrically conductive ink to an effect of an external electric field for magnetizing the conduction pad and
    providing in the magnetic and electrically conductive coupling element at least two different areas provided with opposite magnetic polarities.

* * * * *